US009111622B2

(12) United States Patent
Subramanian et al.

(10) Patent No.: US 9,111,622 B2
(45) Date of Patent: Aug. 18, 2015

(54) SELF REFERENCING SENSE AMPLIFIER FOR SPIN TORQUE MRAM

(71) Applicant: EVERSPIN TECHNOLOGIES, INC., Chandler, AZ (US)

(72) Inventors: Chitra K. Subramanian, Mahopac, NY (US); Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 159 days.

(21) Appl. No.: 13/872,993

(22) Filed: Apr. 29, 2013

(65) Prior Publication Data

US 2013/0301346 A1    Nov. 14, 2013

Related U.S. Application Data

(60) Provisional application No. 61/644,517, filed on May 9, 2012.

(51) Int. Cl.
*G11C 11/16* (2006.01)

(52) U.S. Cl.
CPC .................... *G11C 11/1673* (2013.01)

(58) Field of Classification Search
CPC ......... G11C 11/16; G11C 7/062; G11C 16/28
USPC .......................... 365/210.1, 207, 158, 185.21
See application file for complete search history.

(56) References Cited

U.S. PATENT DOCUMENTS

| | | | |
|---|---|---|---|
| 6,493,251 B2 * | 12/2002 | Hoya et al. ..................... | 365/145 |
| 6,674,679 B1 | 1/2004 | Perner et al. | |
| 6,829,188 B2 | 12/2004 | Baker | |
| 6,954,373 B2 | 10/2005 | Perner | |
| 7,102,913 B2 | 9/2006 | Nazarian | |
| 7,280,423 B1 | 10/2007 | Kuo | |
| 7,852,665 B2 | 12/2010 | Chen et al. | |
| 8,149,627 B2 * | 4/2012 | Liao et al. ................. | 365/185.21 |
| 2010/0020622 A1 * | 1/2010 | Kang et al. ............... | 365/189.09 |
| 2010/0110785 A1 * | 5/2010 | Chen et al. ..................... | 365/171 |
| 2011/0051532 A1 * | 3/2011 | Barth et al. ............... | 365/189.09 |
| 2011/0216601 A1 * | 9/2011 | Liao et al. ................. | 365/185.21 |
| 2012/0235708 A1 * | 9/2012 | Slamowitz ...................... | 327/53 |
| 2014/0269029 A1 * | 9/2014 | Kinney et al. ................. | 365/158 |

OTHER PUBLICATIONS

International Searching Authority, International Search Report and Written Opinion for International Application No. PCT/US13/39466, mailed Oct. 29, 2013.

* cited by examiner

*Primary Examiner* — Richard Elms
*Assistant Examiner* — Jerome Leboeuf (57) ABSTRACT

Circuitry and a method provide self-referenced sensing of a resistive memory cell by using its characteristic of resistance variation with applied voltage in one state versus a relatively constant resistance regardless of the applied voltage in its opposite state. Based on an initial bias state with equalized resistances, a current comparison at a second bias state between a mock bit line and a bit line is used to determine the state of the memory cell, since a significant difference in current implies that the memory cell state has a significant voltage coefficient of resistance. An offset current applied to the mock bit line optionally may be used to provide symmetry and greater sensing margin.

19 Claims, 5 Drawing Sheets

SELF REFERENCING SENSE AMPLIFIER FOR SPIN TORQUE MRAM

CROSS REFERENCE TO RELATED APPLICATION

This application claims the benefit of U.S. Provisional Application No. 61/644,517 filed 9 May 2012.

TECHNICAL FIELD

The exemplary embodiments described herein generally relate to integrated magnetic devices and more particularly relate to methods for reading magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of the reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance may be configured to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bitcell select devices in both current directions can limit the scalability of ST-MRAM.

Figure 1:
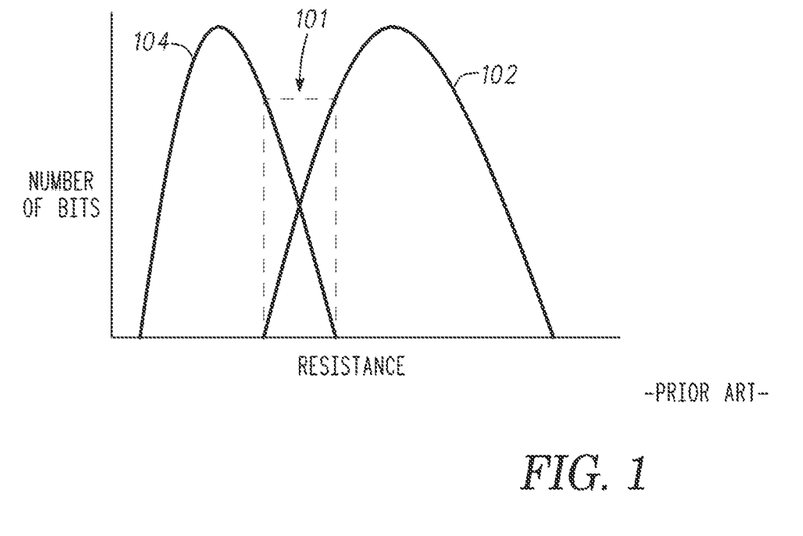
FIG. 1 is a graph of known high and low states of the resistance of a number of bits of an array.

Referring to FIG. 1, a high ST-MRAM MTJ resistance variation and low magnetoresistance (MR) results in an overlapping distribution of resistances for high state bits 102 and low state bits 104. Known referenced read/sensing schemes using reference bits cannot distinguish high and low states successfully for 100% of the bits. Even if the number of bits in the overlapped region 101 is very low (or even zero), due to low MR and high resistance variation of the high and low state bits, a mid-point reference distribution can overlap with low or high state distributions causing read failure. Self-referenced read that references the bit being read/sensed to itself is known in the prior art to address the aforementioned sensing problem. Self-referenced sensing is typically done by sampling the resistance, resetting the bit to a known state, and evaluating the resistance difference to sense the original bit state. To avoid this destructive sensing, an alternate self-referenced sensing scheme called 'slope sensing' detects the presence or relative absence of a negative voltage coefficient of the bit resistance to determine the bit state (see U.S. Pat. No. 6,954,373). Practical implementation of this 'slope sensing' is difficult because it involves the comparison of currents from two different control variable bias conditions and that has required assumptions about the expected slope of resistance versus applied voltage in the high and low bit states in the prior art. These constraints make this type of sensing approach too restrictive to be useful or applicable over a wide range of bit resistance distributions.

Accordingly, it is desirable to provide a ST-MRAM self-referencing sense amplifier circuit and a method for self-referenced reading of bits by a slope sensing scheme that does not require resetting the bit, provides greater security of the stored data by remaining non-volatile, less power consumption, and improved bit lifetime. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for reading a spin-torque magnetoresistive random access memory.

A first exemplary embodiment is a method of reading data from each of a plurality of memory cells in a spin-torque magnetoresistive memory array, wherein each of a group of the memory cells are coupled to a bit line, the method comprising providing a first voltage to the bit line and a second voltage to a mock bit line; sampling the first voltage on the bit line; adjusting the second voltage on the mock bit line to match the sampled first voltage on the bit line; providing a third voltage to the bit line and a fourth voltage to the mock bit line; comparing a current difference between the bit line with the third voltage and the mock bit line with the fourth voltage; and determining the state of the bit in response to the comparison of the current difference.

A second exemplary embodiment is a method of reading data from each of a plurality of memory cells in a spin-torque magnetoresistive memory array, wherein each of a group of the memory cells are coupled to a bit line, the method comprising providing a first voltage to the bit line and a second voltage to a mock bit line; sampling the first voltage on the bit line; adjusting the second voltage on the mock bit line to match the first voltage on the bit line; providing a third voltage to the bit line and a fourth voltage to the mock bit line; providing an offset current to the mock bit line; generating a fifth voltage based on the third voltage, and a sixth voltage based on the fourth voltage; comparing a voltage difference between the fifth voltage and the sixth voltage; and determining the state of the bit in response to the comparison of the voltage difference.

A third exemplary embodiment is a spin-torque magnetoresistive memory array, including a plurality of memory cells selectively coupled to a bit line, the array comprising a mock bit line; a mock memory cell selectively coupled to the mock bit line; a multiplexer coupled to the bit line, mock bit line, memory cell, and mock memory cell and configured to select one of a plurality of bit lines; provide a first voltage to a bit line and a second voltage to a mock bit line; sample the first voltage on the bit line; adjust the second voltage on the mock bit line to match the first voltage on the bit line; provide a third voltage to the bit line and a fourth voltage to the mock bit line; generate a fifth voltage based on the third voltage and a sixth voltage based on the fourth voltage; compare the voltage difference between the fifth voltage and the sixth voltage; and determine the state of the bit in response to the comparison of the voltage differences; a comparator coupled to the multiplexor and the mock memory cell and configured to compare a voltage difference between a bit line voltage and a mock bit line voltage; and a sense amplifier coupled to the bit line and the mock bit line and configured to sense a difference in current on the bit line and the mock bit line by generating the fifth voltage and the sixth voltage required.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to reading and programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through a first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross a nonmagnetic spacer and then, through conservation of spin angular momentum, exert a spin torque on the second magnetic layer that causes precession of its magnetic moment and switching to a different stable magnetic state if the current is in the proper direction. When the net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided that the magnitude of the current is above a second critical current value. Switching in this reverse direction involves a fraction of the electrons reflecting from the interface between the spacer and the first magnetic layer and traveling back across the nonmagnetic spacer to interact with the second magnetic layer.

Magnetoresistance (MR) is the property of a material which allows it to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

The exemplary embodiments described herein provide a method and circuit implementation for self-referenced sensing of a resistive memory cell by using its characteristic of resistance variation with applied voltage in one state versus a relatively constant resistance regardless of the applied voltage in its opposite state. An NMOSFET is biased in the linear region to replicate, or mock, the bit resistance as sampled under one applied voltage bias condition and provides a constant NMOSFET resistance as a reference to compare against the actual resistance of the bit at a second applied voltage bias condition. In the sample phase, a comparator circuit within the sense-amplifier adjusts the gate voltage of the NMOSFET to mock the bit resistance with the NMOSFET channel resistance under a first applied voltage bias condition. In an evaluation phase, a second applied voltage bias is applied to both the drain of the mock NMOSFET as well as to the bit, while the NMOSFET channel resistance is kept constant as determined in the sample phase by holding its gate voltage constant. A current comparison between the mock NMOSFET and the bit circuit leg is used to determine the state of the bit, since a significant difference in current implies that the bit state has a significant voltage coefficient of resistance. An offset current applied to one side optionally may be used to provide greater sensing margin.

Figure 2:
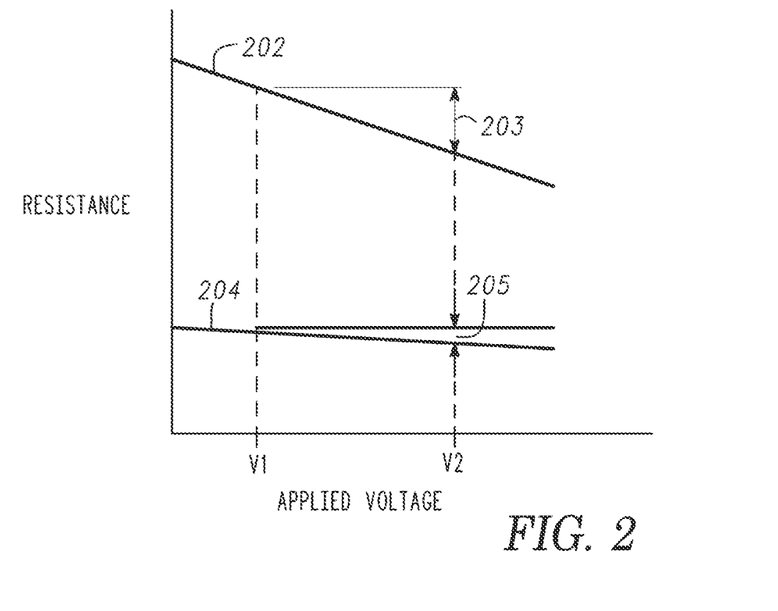
FIG. 2 is a graph of voltage versus resistance illustrating the slope sensing method in accordance with a first exemplary embodiment.

Referring to FIG. 2, it is seen that MTJ bit resistance (vertical axis) reduces as the applied voltage (horizontal axis) across it increases. The slope 203 of the MTJ resistance versus applied voltage is higher for a bit that is in its high resistance state 202 than the slope 205 of the MTJ resistance for a bit that is in its low resistance state 204. The exemplary embodiments described herein measure the resistance slope 203, 205 to determine the state of the bit without switching the bit state during the sensing process as discussed below in more detail.

Figure 3:
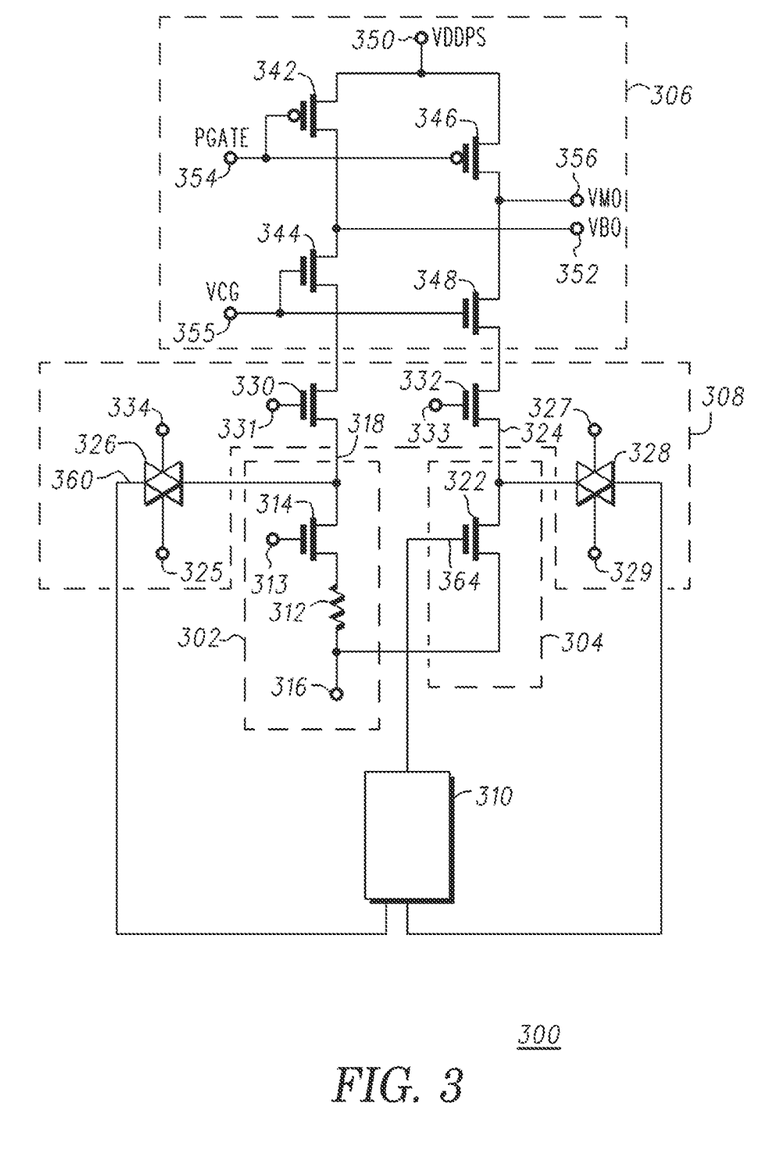
FIG. 3 is a partial general circuit diagram of an ST-MRAM self-referencing sense amplifier in accordance with the first exemplary embodiment.

A first circuit exemplary embodiment is shown in FIG. 3 as a partial schematic of a ST-MRAM self-referencing sense amplifier 300 including a bit 302, a mock bit 304, a sense amplifier preamp 306, a multiplexer 308, and a comparator 310. The bit (or memory cell) 302 includes a MTJ 312 (represented by a resistor) coupled between a selection transistor 314 and a reference voltage 316. The selection transistor 314 has a first electrode coupled to a bit line 318, a second electrode coupled to the MTJ 312, and a control electrode 313 coupled to receive a timed signal.

The mock bit 304 includes a transistor 322 having a first electrode coupled to the mock bit line 324, a second electrode coupled to the reference voltage 316, and a control electrode 364 coupled to the comparator 310.

The multiplexer 308 includes a first transmission gate 326, a second transmission gate 328, a bit line selection transistor 330, and a mock bit line selection transistor 332. The transmission gate 326 has a first electrode connected to the bit line 318, a second electrode 360 connected to the comparator 310, a first gate 334 coupled to receive a timed signal, and a second gate 325 coupled to receive a timed signal. The second transmission gate 328 has a first electrode connected to the mock bit line 324, a second electrode 362 connected to the comparator 310, a first gate 327 coupled to receive a timed signal, and a second gate 329 coupled to receive a timed signal. The bit line selection transistor 330 has a first electrode connected to the sense amplifier preamp 306, a second electrode connected to the bit line 318, and a control electrode coupled 331 coupled to receive a timed signal. The mock bit line selection transistor 332 has a first electrode connected to the sense amplifier preamp 306, a second electrode connected to the mock bit line 324, and a control electrode coupled 333 coupled to receive a timed signal.

The sense amplifier preamp 306 includes transistors 342, 344, 346, and 348. The transistor 342 has a first electrode connected to a reference voltage 350, a second electrode connected to bit voltage output 352, and a control electrode connected to a gate reference input voltage 354. The transistor 344 has a first electrode connected to the bit voltage output 352, a second electrode connected to the first electrode of transistor 330, and a control electrode connected to a gate reference voltage input 355. The transistor 346 has a first electrode connected to a reference voltage 350, a second electrode connected to mock bit voltage output 356, and a control electrode connected to a gate voltage input 354. The transistor 348 has a first electrode connected to the mock bit voltage output 356, a second electrode connected to the first electrode of transistor 332, and a control electrode connected to a gate reference voltage input 355.

Figure 4:
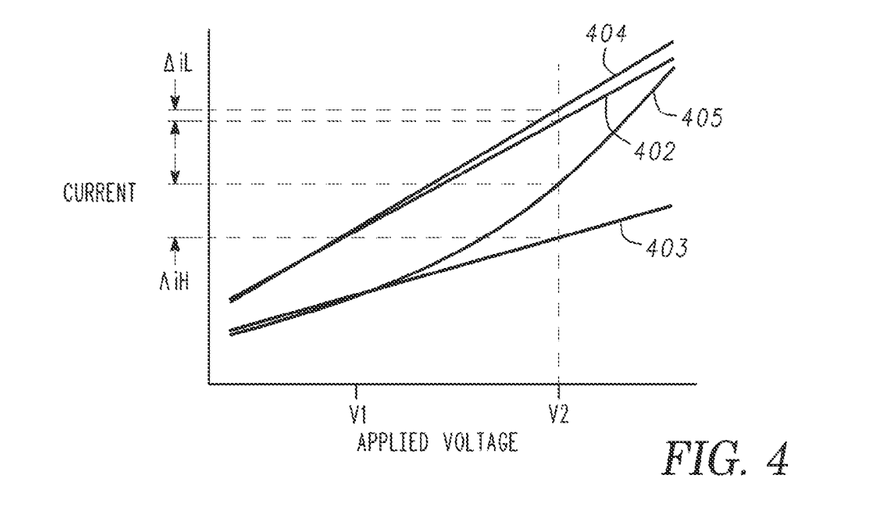
FIG. 4 is a graph of current versus applied voltage illustrating the slope sensing method in accordance with the first exemplary embodiment.

Referring to FIG. 2 as well as FIG. 3, to sense the slope of the MTJ resistance 202, the mock NMOS transistor 322 is first biased in its linear region of operation. The channel resistance of this NMOS transistor 322 is modulated by adjusting its gate voltage such that its resistance matches the resistance of the MTJ bit 312 at one applied bias, for example, V1 of FIG. 4. Note that the graph shows, at $V_1$, the high state mock bit current 403 is equal to the high state MTJ bit current 405, and the low state mock bit current 402 is equal to the low state MTJ bit current 404. The output voltages on nodes 352, 356 of the sense amplifier preamp 306 are held equalized so that there is no current difference between the MTJ 312 and the mock NMOS transistor 322 at bias V1. Therefore, due to the symmetry of the circuit, the mock bit resistance is equal to the resistance of the MTJ bit at bias V1, regardless of whether the MTJ bit is in its high or low resistance state. Since the NMOS transistor 322 channel resistance remains constant with applied bias across it when the device is operating in the linear region, the MTJ resistance slope can be sensed by using a second applied bias, for example, V2, with the mock bit 304 resistance providing a reference point for the MTJ bit 302 resistance at bias V1. Note that the graph, at V2, of the high state MTJ bit current 405 varies significantly from the high state mock bit current 403, whereas the low state MTJ bit current 404 does not vary significantly from the low state mock bit current 402. The equalization of output node voltages on nodes 352 and 356 is turned off and the sense amplifier preamp 306 detects the degree of resistance change at outputs 352, 356 as a voltage difference due to the current differential between the MTJ 312 and the mock NMOS transistor 322 at bias V2 to sense the state of the bit 302.

In operation, the first exemplary embodiment includes applying a bias voltage at terminal 354 and at the gates of transistors 344 and 348 for providing a current to both the bit line 318 and the mock bit line 324 that biases them to voltage level V1. The bit line 318 voltage and the mock bit line 324 voltage are provided by the transmission gates 326 and 328, respectively, to the comparator 310. The voltage on the bit line 318 is sampled as voltage 360 by comparator 310, and the gate voltage at 364 is adjusted to provide a matching voltage on the mock bit line 324 sampled as voltage 362 by the comparator. A second bias voltage, preferably higher than the first bias voltage, is applied at terminal 354. The voltages on the bit line and mock bit line output terminals 352 and 356 are compared. If the bit line voltage is significantly less than the mock bit line voltage, the bit state is high ("1"). If the bit line voltage is similar to the mock bit line voltage, the bit state is low ("0").

Figure 5:
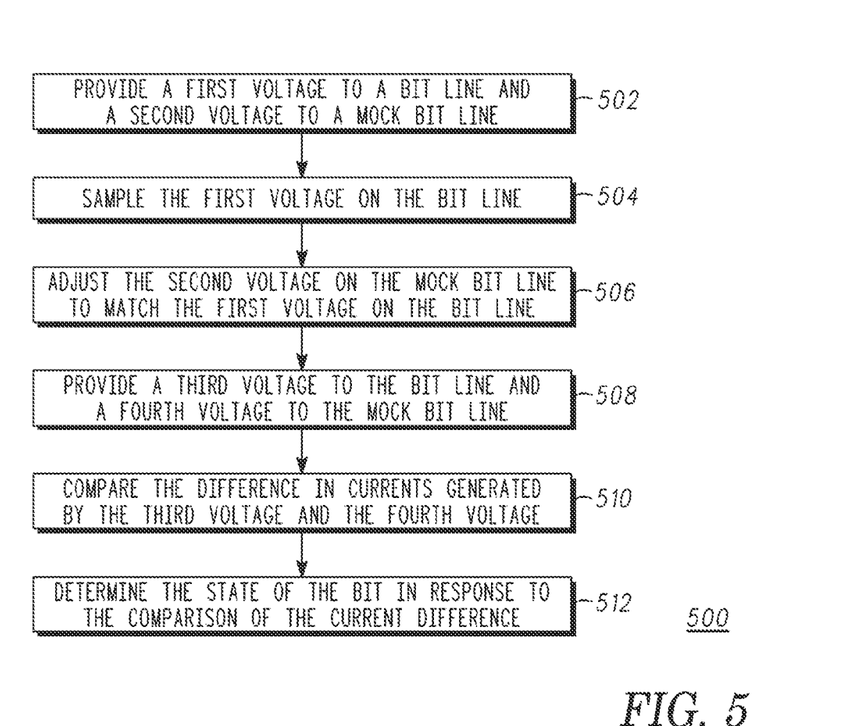
FIG. 5 is a flow chart of the steps for reading a self-referencing sense amplifier in accordance with the first exemplary embodiment.
Figure 7:
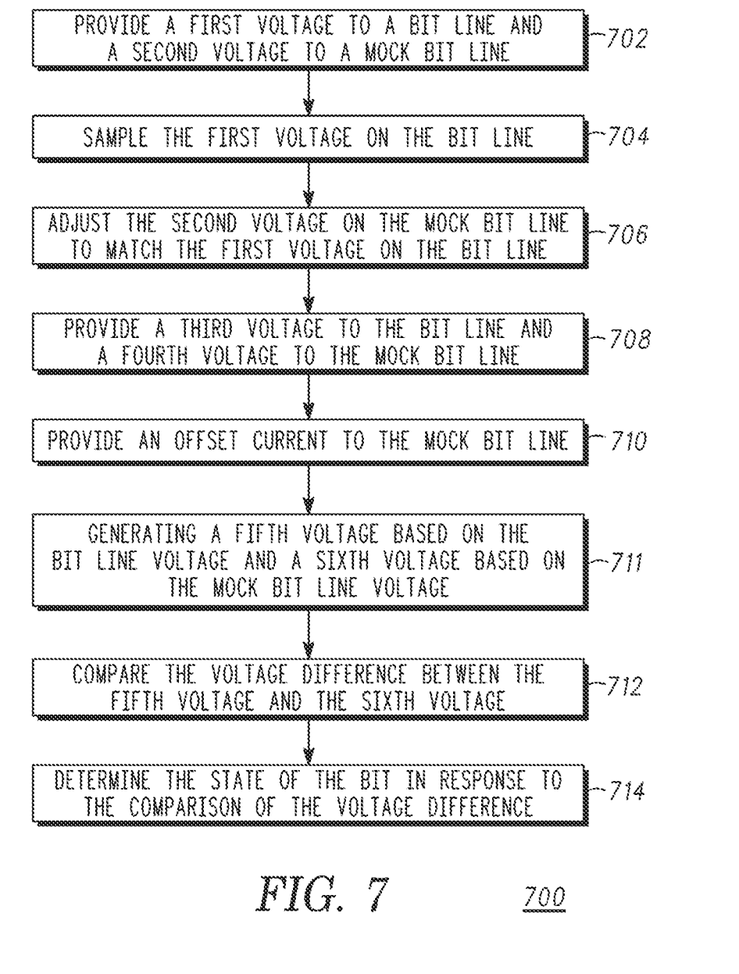
FIG. 7 is a flow chart of the steps for reading a self-referencing sense amplifier in accordance with the second exemplary embodiment.

FIGS. 5 and 7 are flow charts that illustrate an exemplary embodiment of methods 500 and 700, respectively. The various tasks performed in connection with methods 500 and 700 may be performed by software, hardware, firmware, or any combination thereof For illustrative purposes, the following description of methods 500 and 700 may refer to elements mentioned above in connection with other FIGS. In practice, portions of methods 500 and 700 may be performed by different elements of the described system. It should be appreciated that methods 500 and 700 may include any number of additional or alternative tasks, the tasks shown in FIGS. 5 and 7 need not be performed in the illustrated order, and methods 500 and 700 may be incorporated into a more comprehensive procedure or process having additional functionality not described in detail herein. Moreover, one or more of the tasks shown in FIGS. 5 and 7 could be omitted from an embodiment of the methods 500 and 700 as long as the intended overall functionality remains intact.

The flow chart of FIG. 5 describes this operation and includes providing 502 a first voltage to the bit line 318 and a second voltage to the mock bit line 324, sampling 504 the first voltage on the bit line 318, adjusting 506 the second voltage on the mock bit line 324 to match the first voltage on the bit line 318, providing 508 a third voltage to the bit line 318 and a fourth voltage to the mock bit line 324, comparing 510 the difference in currents generated by the third voltage and the fourth voltage, and determining 512 the state of the bit in response to the comparison of the current difference.

Figure 6:
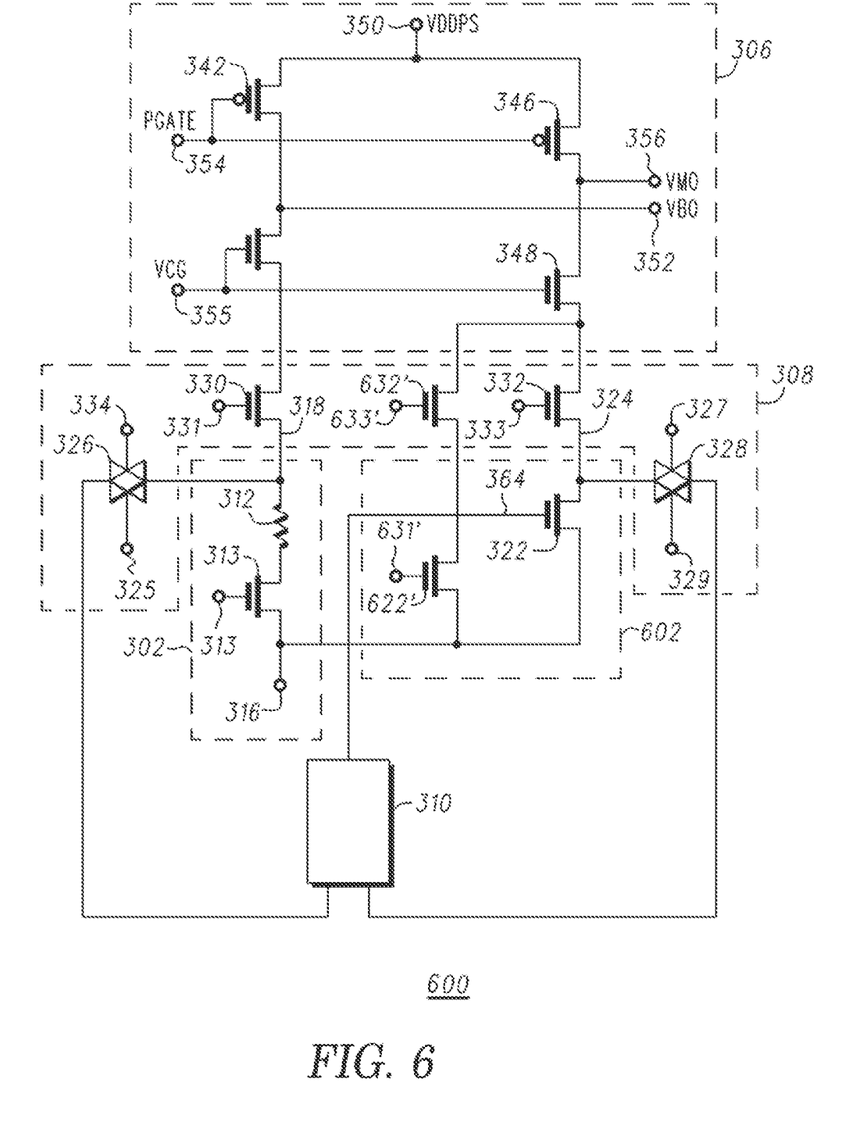
FIG. 6 is a partial general circuit diagram of an ST-MRAM self-referencing sense amplifier in accordance with a second exemplary embodiment.

A second circuit exemplary embodiment is shown in FIG. 6 as a partial schematic of a ST-MRAM self-referencing sense amplifier 600 including a bit 302, a sense amplifier preamp 306, a multiplexer 308, and a comparator 310, wherein like numbers may be used to identify like elements to those of FIG. 3. This second exemplary embodiment includes, in addition to those elements of FIG. 3, a transistor 622' within the mock bit 602 and having a control electrode coupled to the comparator, an electrode coupled to the reference voltage 316, and an electrode coupled to an electrode of transistor 632'. Transistor 632' has a control electrode 633' coupled to receive a timed signal. The bias provided to transistor 342 can be configured as a diode connection to the gate reference input voltage 354 as shown. Alternately, the bias diode connection can be made at transistor 346 or the bias can be from an externally driven source (not shown).

To allow the magnitude of the voltages at outputs 352 and 356 to move in opposite directions depending on bit state and to increase the sensing signal, an offset current is provided by transistors 622 and 632 during the sensing phase. The offset current represents about an additional 10% current draw from the output voltage 356 in order to make the transistor 322 appear to have a slightly lower resistance at $V_2$ during sensing signal development only, than was matched at $V_1$. This offset current provides an adjustable way to obtain a mid-state reference using transistor 322 so that the reference current magnitude of the transistor 322 is between the high and low bit states. Therefore, at the final stage of sensing, when the voltages on the bit line and mock bit line output terminals 352 and 356 are compared, if the bit line output voltage 352 is less than the mock bit line output voltage 356, the bit state is high ("1") and if the bit line output voltage 352 is greater than the mock bit line output voltage 356, the bit state is low ("0").

The flow chart of FIG. 7 describes this operation and includes providing 702 a first voltage to the bit line 318 and a second voltage to the mock bit line 324, sampling 704 the first voltage on the bit line 318, adjusting 706 the second voltage on the mock bit line 324 to match the first voltage on the bit line 318, providing 708 a third voltage to the bit line 318 and a fourth voltage to the mock bit line 324, providing 710 an offset current to the mock bit line, generating 711 a fifth voltage based on the bit line 318 voltage and a sixth voltage based on mock bit line 324 voltage, comparing 712 the voltage difference between the fifth voltage and the sixth voltage, and determining 714 the state of the bit in response to the comparison of the voltage differences.

While the magnitude of the voltage $V_2$ is preferred to be greater than that of $V_1$, in another embodiment the magnitude of the voltage $V_2$ would be less than that of $V_1$.

The bias voltage $V_1$ and $V_2$ may be of opposite polarity to take advantage of asymmetry in the resistance versus bias characteristics.

The sense amplifier preamp 306 could use the bias voltage at electrode 364 applied to the gate of transistor 322 under bias conditions of $V_1$ and $V_2$ as its outputs by calibrating the transistor 322 under both bias conditions and generating two different bias voltage values for comparison as the sense signal.

This described embodiments show a PMOS transistor 346 and an NMOS transistor 322 to mock the MTJ bit 302. Alternately, NMOS current sources and a mock PMOS device may be used.

The voltage reference 316, for example, ground, of the sense amplifier preamp 306, in another embodiment, would be at a voltage above ground and regulated by a PMOS follower circuit (not shown) for increased power supply rejection.

While at least one exemplary embodiment has been presented in the foregoing detailed description, it should be appreciated that a vast number of variations exist. Furthermore, the exemplary embodiments may be applied to a memory array comprising any resistive memory elements. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of reading data from a spin-torque magnetoresistive memory cell coupled to a bit line, the memory cell having resistance variation with applied voltage in a first state, and the memory cell having relatively constant resistance regardless of applied voltage in a second state, the method comprising:
    biasing a transistor to operate in a linear region, wherein the transistor is coupled to a mock bit line;
    providing a first applied voltage to the bit line and to the mock bit line;
    while the first applied voltage is provided, adjusting a gate voltage of the transistor such that resistance of the transistor matches resistance of the memory cell;
    after adjusting the gate voltage, providing a second applied voltage to the bit line and to the mock bit line;
    comparing a current difference between the bit line with the second applied voltage and the mock bit line with the second applied voltage; and
    determining whether the memory cell is in the first state or the second state in response to the comparison of the current difference.

2. The method of claim 1, wherein biasing the transistor further comprises:
    biasing one of an NMOS transistor or a PMOS transistor coupled to the mock bit line to operate in the linear region.

3. The method of claim 2 wherein the adjusting the gate voltage further comprises:
    applying a voltage to the gate of the NMOS or PMOS transistor to adjust the resistance of the transistor in the linear region to match the resistance of the memory cell.

4. The method of claim 1 further comprising:
    while providing the second applied voltage to the mock bit line, providing an offset current that makes the transistor appear to have a slightly lower resistance at the second applied voltage.

5. The method of claim 4, wherein the offset current is adjustable.

6. The method of claim 1, wherein providing the first applied voltage further comprises:

applying a first bias voltage at a gate electrode of a first transistor coupled to the bit line to provide a current to the bit line that biases the bit line to the first applied voltage; and
applying the first bias voltage at a gate electrode of a second transistor coupled to the mock bit line to provide the current to the mock bit line that biases the mock bit line to the first applied voltage.

7. The method of claim 6, wherein providing the second applied voltage further comprises:
    applying a second bias voltage at the gate electrode of the first transistor coupled to the bit line; and
    applying the second bias voltage at the gate electrode of the second transistor coupled to the mock bit line.

8. The method of claim 7 wherein the comparing the current difference further comprises:
    comparing drain voltages of transistors used in providing the current to the bit line and the mock bit line.

9. The method of claim 1 wherein determining whether the memory cell is in the first state or the second state further comprises determining the memory cell is in the first state when the current difference is a significant difference signifying a significant voltage coefficient of resistance.

10. A method of reading data from each of a plurality of memory cells in a spin-torque magnetoresistive memory array, wherein each of a group of the memory cells are coupled to a bit line, the method comprising:
    providing a first voltage to the bit line and a second voltage to a mock bit line;
    sampling the first voltage on the bit line;
    adjusting the second voltage on the mock bit line to match the first voltage on the bit line;
    providing a third voltage to the bit line and a fourth voltage to the mock bit line;
    while providing the fourth voltage, providing an offset current to the mock bit line;
    generating a fifth voltage based on the third voltage, and a sixth voltage based on the fourth voltage;
    comparing a voltage difference between the fifth voltage and the sixth voltage; and
    determining state of the memory cell in response to the comparison of the voltage difference.

11. The method of claim 10 further comprising:
    biasing one of a NMOS transistor or a PMOS transistor coupled to the mock bit line to operate in a linear region with a resistance equivalent to the memory cell.

12. The method of claim 11 wherein the adjusting the second voltage further comprises:
    applying a voltage to the gate of the NMOS or PMOS transistor to adjust its equivalent resistance in the linear region to match resistance of the memory cell.

13. The method of claim 10 wherein the providing an offset current further comprises:
    selecting an offset current that provides a mid-point operation of a sense amplifier.

14. The method of claim 10, wherein providing the first voltage further comprises applying a first bias voltage at a gate electrode of a first transistor coupled to the bit line to provide a current to the bit line that biases the bit line to the first voltage; and
    wherein providing the second voltage further comprises applying the first bias voltage at a gate electrode of a second transistor coupled to the mock bit line to provide the current to the mock bit line that biases the mock bit line to the second voltage.

15. The method of claim 14 wherein the comparing the voltage difference further comprises:

comparing drain voltages of transistors used in providing the current to the bit line and the mock bit line.

16. The method of claim 10 wherein determining the state of the memory cell further comprises determining the memory cell based on a degree of resistance change corresponding to the voltage difference.

17. The method of claim 10, wherein the offset current is adjustable.

18. A spin-torque magnetoresistive memory, comprising:
a memory cell selectively coupled to a bit line, the memory cell having resistance variation with applied voltage in a first state, and the memory cell having relatively constant resistance regardless of applied voltage in a second state,
a mock bit line;
a mock memory cell selectively coupled to the mock bit line, wherein the mock memory cell includes a transistor biased to operate in a linear region;
a multiplexer coupled to the bit line and the mock bit line, the multiplexer configured to:
provide a first voltage to the bit line and the mock bit line; and
provide a second voltage to the bit line and the mock bit line;
a comparator coupled to the multiplexer and the mock memory cell, the comparator configured to adjust a gate voltage of the transistor such that resistance of the transistor matches resistance of the memory cell; and
a sense amplifier coupled to the bit line and the mock bit line, the sense amplifier configured to determine a state of the memory cell based on a difference in current between the bit line and the mock bit line while the second voltage is provided to the bit line and the mock bit line.

19. The spin-torque magnetoresistive memory of claim 18, further comprising:
transistors coupled to the mock bit line to generate an adjustable offset current, the transistors configured to generate the adjustable offset current when the second voltage is provided to the mock bit line.

* * * * *